(12) United States Patent
Yang

(10) Patent No.: US 9,721,797 B2
(45) Date of Patent: Aug. 1, 2017

(54) SEMICONDUCTOR DEVICE

(71) Applicant: SK hynix Inc., Gyeonggi-do (KR)

(72) Inventor: Young Ho Yang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/041,820

(22) Filed: Feb. 11, 2016

(65) Prior Publication Data
US 2017/0084748 A1 Mar. 23, 2017

(30) Foreign Application Priority Data
Sep. 22, 2015 (KR) .................. 10-2015-0134203

(51) Int. Cl.
| | | |
|---|---|---|
| *H01L 29/788* | (2006.01) | |
| *H01L 29/06* | (2006.01) | |
| *H01L 29/167* | (2006.01) | |
| *H01L 21/28* | (2006.01) | |
| *H01L 29/423* | (2006.01) | |
| *H01L 27/11521* | (2017.01) | |
| *H01L 21/02* | (2006.01) | |
| *H01L 21/768* | (2006.01) | |
| *H01L 23/532* | (2006.01) | |
| *H01L 21/311* | (2006.01) | |
| *H01L 27/11556* | (2017.01) | |

(52) U.S. Cl.
CPC .. *H01L 21/28273* (2013.01); *H01L 27/11521* (2013.01); *H01L 29/42324* (2013.01); *H01L 29/7889* (2013.01); *H01L 21/02074* (2013.01); *H01L 21/311* (2013.01); *H01L 21/76832* (2013.01); *H01L 23/53295* (2013.01); *H01L 27/11556* (2013.01)

(58) Field of Classification Search
CPC ........... H01L 27/11582; H01L 29/7926; H01L 21/76841; H01L 27/11556; H01L 29/66833; H01L 29/7883; H01L 29/0649; H01L 29/167; H01L 29/788; H01L 21/76832; H01L 21/76829; H01L 21/76849; H01L 23/53295; H01L 23/53238; H01L 21/02074; H01L 21/31116; H01L 21/02126; H01L 21/02129; H01L 21/311; H01L 21/31144; H01L 21/76802; H01L 21/768; H01L 23/5329; H01L 21/7684; H01L 23/5226
USPC ....................................................... 257/321
See application file for complete search history.

(56) References Cited

U.S. PATENT DOCUMENTS

2013/0155771 A1* 6/2013 Kim ............... H01L 29/66833
365/185.05

FOREIGN PATENT DOCUMENTS

| KR | 100628882 | 9/2006 |
|---|---|---|
| KR | 1020070067997 | 6/2007 |

* cited by examiner

*Primary Examiner* — Caleen Sullivan
(74) *Attorney, Agent, or Firm* — IP & T Group LLP

(57) ABSTRACT

A semiconductor device and a method for forming the same. The semiconductor device includes a tunnel insulating layer, a charge storage layer including a dopant, and a diffusion barrier layer including at least one of carbon, nitrogen, or oxygen interposed between the tunnel insulating layer and the charge storage layer.

20 Claims, 11 Drawing Sheets

SEMICONDUCTOR DEVICE

CROSS-REFERENCE TO RELATED APPLICATION

The present application claims priority under 35 U.S.C. 119(a) to Korean patent application number 10-2015-0134203, filed on Sep. 22, 2015, the entire disclosure of which is herein incorporated by reference in its entirety.

BACKGROUND

Field of Invention

An aspect of the invention relates to a semiconductor device and a method of manufacturing the same, and more particularly, to a three-dimensional semiconductor device and a method of manufacturing the same.

Description of Related Art

A non-volatile memory device maintains data stored in a semiconductor device although a power supply is disconnected. The non-volatile memory element includes a memory cell for storing data, and the memory cell has a structure in which a tunnel insulating layer, a floating gate, a charge blocking layer and a control gate electrode are sequentially stacked.

The tunnel insulating layer can be formed of an oxide layer, and the floating gate can be formed of a silicon layer including a dopant with a high-concentration. However, in a deposition process and a subsequent heat treatment process of the silicon layer including the dopant with the high-concentration, the dopant included in the floating gate can be diffused into the tunnel insulating layer. In this instance, the layer quality of the tunnel insulating layer can be reduced and features of the memory device can be deteriorated.

SUMMARY

Various embodiments are directed to a semiconductor device with improved layer quality of a tunnel insulating layer, and a method of manufacturing the same.

According to an embodiment, a semiconductor device may include a tunnel insulating layer, a charge storage layer including a dopant; and a diffusion barrier layer interposed between the tunnel insulating layer and the charge storage layer, the diffusion barrier layer including at least one of carbon, nitrogen, or oxygen.

According to an embodiment, a semiconductor device may include alternately stacked conductive layers and insulating layers, a channel layer passing through the alternately stacked conductive layers and the insulating layer, a tunnel insulating layer surrounding the channel layer, charge storage patterns interposed between the tunnel insulating layer and the conductive layers, the charge storage patterns including a dopant, and diffusion barrier patterns interposed between the tunnel insulating layer and the charge storage patterns, the diffusion barrier patterns including at least one of nitrogen, carbon, or oxygen.

According to an exemplary embodiment, a semiconductor device may include alternately stacked conductive layers and insulating layers; a channel layer passing through the alternately stacked conductive layers and the insulating layer; a tunnel insulating layer surrounding the channel layer; a diffusion barrier layer surrounding the tunnel insulating layer, the diffusion barrier layer including at least one of nitrogen, carbon, or oxygen; charge storage patterns interposed between the diffusion barrier layer and the insulating layers, the charge storage patterns including a dopant; and a charge blocking layer interposed between the charge storage patterns and the insulating layers, and between the charge storage patterns and the conductive layers.

DETAILED DESCRIPTION

Figure 1:
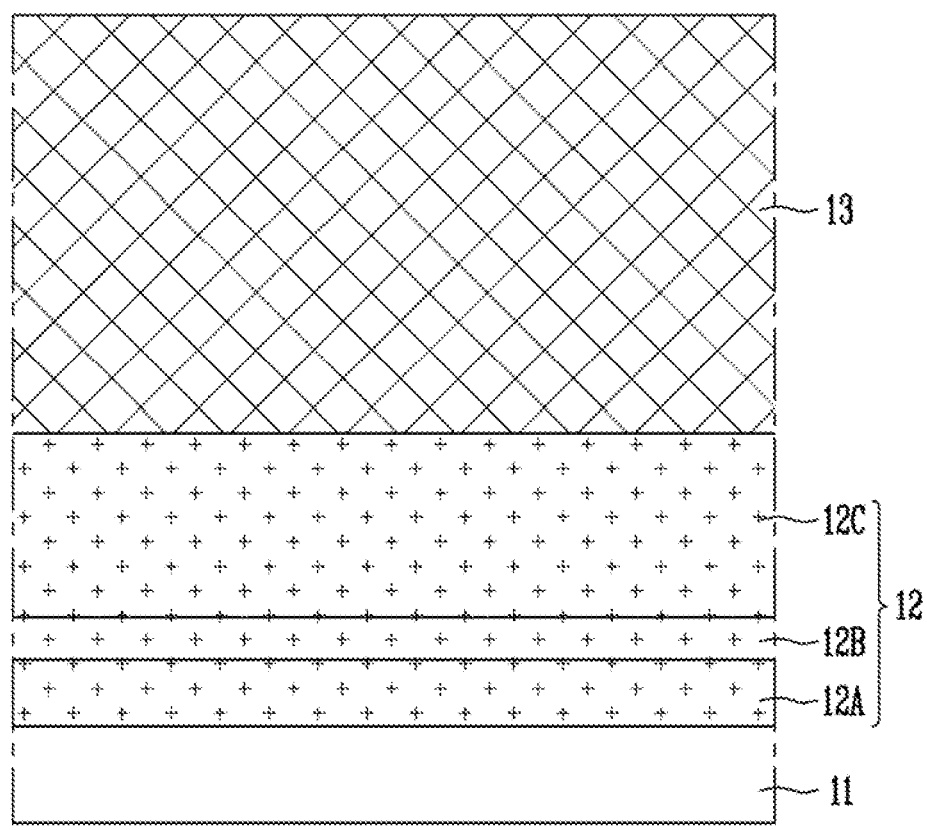
FIG. 1 is a plan view illustrating a structure of a diffusion barrier layer according to an embodiment.

Hereinafter, various exemplary embodiments will be described in detail with reference to the accompanying drawings. In the drawings, thicknesses and lengths of components may be exaggerated for convenience of illustration. In the following description, a detailed description of related functions and constitutions may be omitted for simplicity and conciseness. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a plan view illustrating a structure of a diffusion barrier layer according to an embodiment.

Referring to FIG. 1, a diffusion barrier layer 12 according to an embodiment may be interposed between a tunnel insulating layer 11 and a charge storage layer 13. The diffusion barrier layer 12 may include a doped impurity including at least one of carbon (C), nitrogen (N), or Oxygen (O). The tunnel insulating layer 11 may include, for example, an oxide material. The charge storage layer 13 may, for example, be a floating gate including a polysilicon layer that is doped with a high concentration of an N-type or a P-type impurity dopant. Alternatively, the charge storage layer 13 may include at least one of a nitride material, a nanodot, a phase change material, etc.

As discussed above, the diffusion barrier layer 12 may, for example, be a silicon layer doped with at least one of carbon (C) nitrogen (N), or oxygen (O). The silicon layer may, for example, be a crystalized silicon layer having a crystal gram structure. For example, a polysilicon layer. Further, at least one of carbon (C) nitrogen (N), or oxygen (O) may be located in at least one of a grain, a grain boundary, or a crystal lattice defect. The N-type or a P-type impurity dopant included in the charge storage layer 13 may be diffused to the tunnel insulating layer 11 through at least one of the grain, the grain boundary, or the crystal lattice defect while performing the deposition process, the heat treatment process, etc. Accordingly, diffusion path of the P-type or N-type impurity dopant may be blocked by locating the doped at least one of carbon (C), nitrogen (N), or oxygen (O) in the at least one of the grain, the grain boundary, or the crystal lattice defect of the diffusion barrier layer 12 between the charge storage layer 13 and the tunnel insulating layer 11.

In addition, when the at least one of carbon (C), nitrogen (N), or oxygen (O) is doped, a size of the grain in the silicon layer may be reduced. Accordingly, the diffusion of the P-type or N-type impurity dopant may be prevented. Therefore, the P-type or N-type impurity dopant included in the charge storage layer 13 may be prevented from being diffused to the tunnel insulating layer 11.

For example, the diffusion barrier layer 12 may be a first doped silicon layer 12B including at least one of carbon, nitrogen, or oxygen. In another example, the diffusion barrier layer 12 may include a first doped silicon layer 12B including at least one of carbon, nitrogen, or oxygen and a second dope silicon layer 12C including at least one of carbon, nitrogen, or oxygen and an N-type or the P-type impurity. In another example, the diffusion barrier layer 12 may include an undoped silicon layer 12A, a first doped silicon layer 12B (as described above) and a second doped silicon layer 12C (as described above). In addition, the diffusion barrier layer 12 may be formed of only the first doped silicon layer 12B, only the second doped silicon layer 12C, a combination of the first doped silicon layer 12B and the second doped silicon layer 12C, or a combination of the undoped silicon layer 12A with at least one of the first doped silicon layer 12B or the second doped silicon layer 12C. An arrangement order of the various silicon layers that form the diffusion barrier layer may be varied as necessary.

The N-type impurity may be, for example, phosphorus (P), and the P-type impurity may be, for example, boron (B). Therefore, the second doped silicon layer 12C may include, for example, carbon and phosphorus, nitrogen and phosphorus, oxygen and phosphorus, carbon and boron, nitrogen and boron, or oxygen and boron. In addition, the N-type impurity or the P-type impurity included in the second doped silicon layer 12C may be the same as the N-type or a P-type impurity included in the charge storage layer 13.

The first doped silicon layer 12B may have a smaller thickness than the undoped silicon layer 12A. Further, the first doped silicon layer 12B may have a smaller thickness than the second doped silicon layer 12C. As the thickness of a layer is smaller, a grain size of the layer may be reduced. Accordingly, the first doped silicon layer 12B may have a smaller grain size than the second doped silicon layer 12C. In addition, even though a grain included in the first doped silicon layer 12B is grown by a subsequent heat treatment process a crystal growth rate may be lowered as the thickness of the first doped silicon layer 12B is reduced. In addition, a diffusion rate of the dopant may be lowered as the grain size of the first doped silicon layer 12B is reduced. Accordingly by controlling the thickness of the diffusion barrier layer 12, diffusion of the dopant may be prevented effectively. For example, the thickness of the undoped silicon layer 12A may be about 10 Å to about 80 Å, the thickness of the first doped silicon layer 12B may be about 5 Å to about 20 Å, the thickness of the second coped silicon layer 12C may be about 100 Å to about 300 Å and the thickness of the charge storage layer 13 may be about 200 Å to about 1000 Å.

In an alternative embodiment (not shown) the diffusion barrier layer 12 may be a part of the charge storage layer 13. For example, the charge storage layer 13 may be formed of the multilayer, and a part of the multilayer may be the diffusion barrier layer 12. In this instance, a charge may be stored in the diffusion barrier layer 12.

FIGS. 2A to 2D are plan views illustrating a structure of a semiconductor device according to an embodiment. Specifically, FIGS. 2A to 2D are perspective views representing a structure of a memory cell. Hereinafter, the description overlapping with the above will be omitted.

Figure 2A:
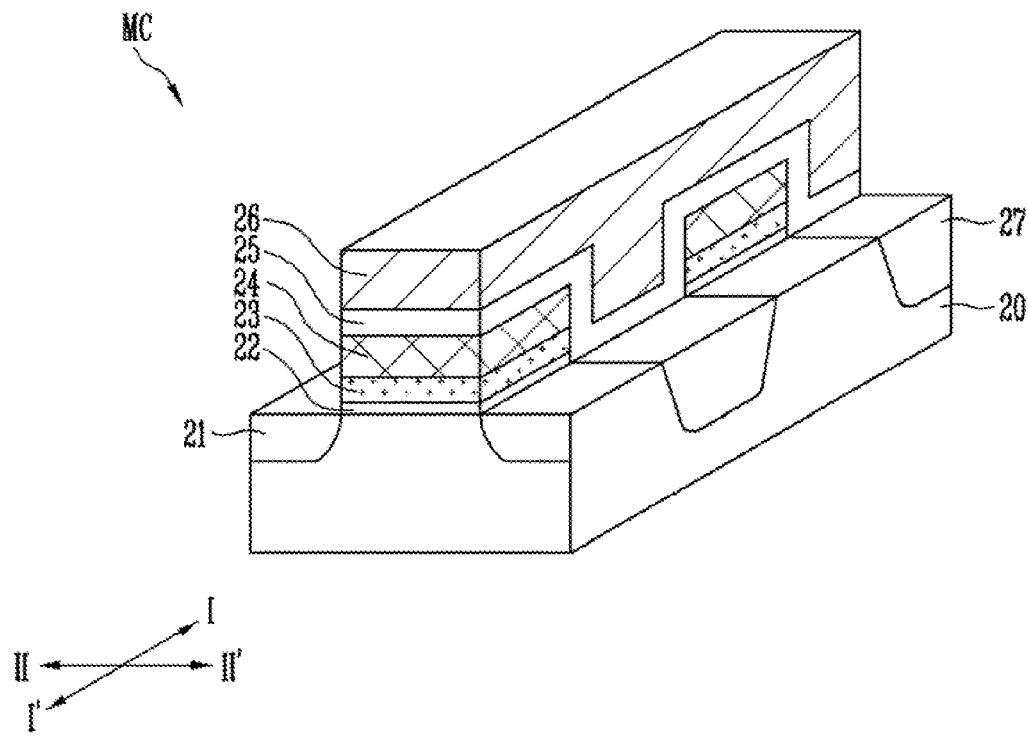
FIGS. 2A to 2D are plan views illustrating a structure of a semiconductor device according to an embodiment.

Referring to FIG. 2A, a memory cell MC according to an embodiment may include a tunnel insulating layer 22, a diffusion barrier layer 23, a charge storage layer 24, a charge blocking layer 25, and a gate electrode 26 sequentially stacked on a substrate 20. The tunnel insulating layer 22, the diffusion barrier layer 23 and the charge storage layer 24 may be arranged to be spaced apart from one another by a predetermined distance, and have an island pattern. The charge blocking layer 25 and the gate electrode 26 may be in a line pattern extended in a first direction I-I'. The tunnel insulating layer 22, the diffusion barrier layer 23, the charge storage layer 24, the charge blocking layer 25 and the gate electrode 26 may form a gate pattern. A junction 21 may be formed at both sides of the gate pattern, and a channel may be formed between the junctions 21. Further, an isolation layer 27 extended in a second direction which intersects with the first direction I-I' may be formed in the substrate 20.

The diffusion barrier layer 23 may be interposed between the tunnel insulating layer 22 and the charge storage layer 24, and have a material and a structure described referring to FIG. 1.

The charge storage layer 24 may store data by inputting or outputting the charge, and, as discussed above, include a polysilicon layer that is doped with a high concentration of an N-type or a P-type impurity dopant.

The charge blocking layer 25 may include a dielectric material having high dielectric constant (high k), for example, Alumina ($Al_2O_3$). Further, the gate electrode 26 may include polysilicon, a metal material, etc.

Figure 2B:
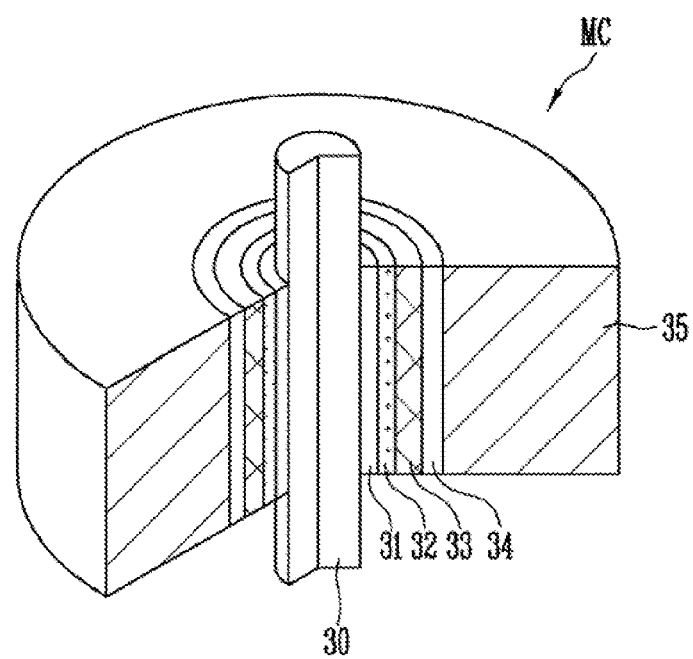

Referring to FIG. 2B, the memory cell MC according to an embodiment may include a vertical channel layer 30, the tunnel insulating layer 31, the diffusion barrier layer 32, the charge storage layer 33, the charge blocking layer 34 and the gate electrode 35 sequentially surrounding the vertical channel layer 30.

The diffusion barrier layer 32 may be interposed between the tunnel insulating layer 31 and the charge storage layer 33, and have the material and the structure described referring to FIG. 1. The charge blocking layer 34 may be interposed between the charge storage gate 33 and the gate electrode 35. Since the gate electrode 35 may surround the vertical channel layer 30, the memory cell MC may have a gate all around (GAA) structure.

Although not shown in the figure, plurality of memory cells MC may be stacked using the same vertical channel layer 30. In this instance, insulating layers may be interposed between the stacked gate electrodes 35, and the gate electrodes 35 may be insulated mutually by the insulating layers. The charge storage layers 33 and the charge blocking layers 34 of the stacked memory cells may be separated from each other by the insulating layers.

Figure 2C:
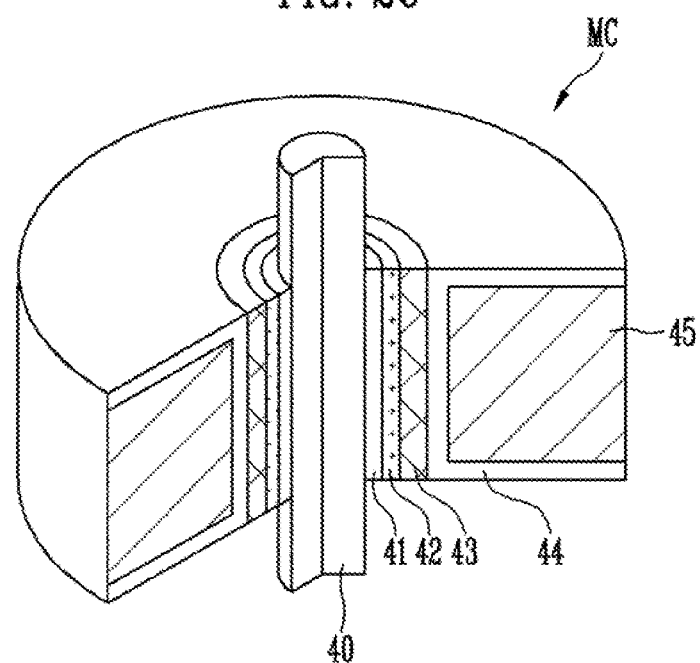

Referring to FIG. 2C, the memory cell MC according to an embodiment may include the vertical channel layer 40, the tunnel insulating layer 41, the diffusion barrier layer 42, the charge storage layer 43, the charge blocking layer 44 and the gate electrode 45 surrounding the sidewall of the vertical channel layer 40 sequentially.

The diffusion barrier layer 42 may be interposed between the tunnel insulating layer 41 and the charge storage layer 43, and include the material and structure described referring to FIG. 1. The charge blocking layer 44 may be interposed between the charge storage layer 43 and the gate electrode 45, and may have a C shape surrounding the gate electrode 45.

In an exemplary embodiment, the memory cell MC may include both the charge blocking layer 34 described referring to FIG. 2B and the charge blocking layer 44 described referring to FIG. 2C.

Figure 2D:
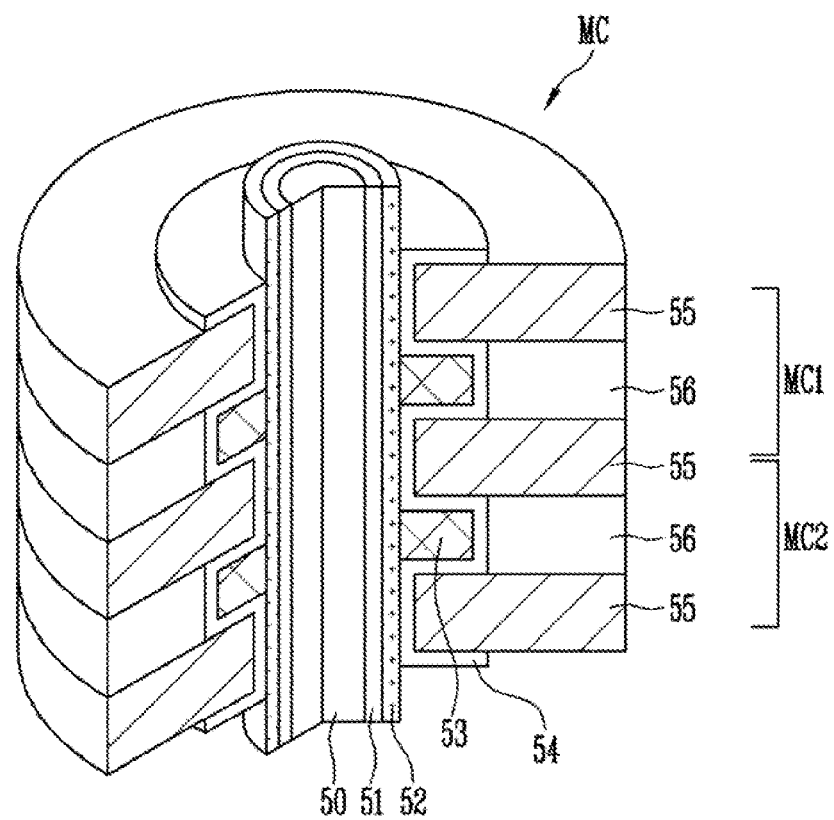

Referring to FIG. 2D, the memory cells MC1 and MC2 according to an embodiment may include the vertical channel layer 50 and the tunnel insulating layer 51, the diffusion barrier layer 52, charge storage layers 53, the charge blocking layer 54, stacked gate electrode 55, and an insulating layers 56.

The tunnel insulating layer 51 may surround the vertical channel layer 50, and the diffusion barrier layer 52 may be formed to surround the tunnel insulating layer 52. The diffusion barrier layer 52 may have the material and the structure described referring to FIG. 1.

The stacked gate electrodes 55 may surround the vertical channel layer 50, the tunnel insulating layer 51, the diffusion barrier layer 52, and the charge storage layer 54. The charge storage layers 53, the charge blocking layer 54, and the insulating layers 56 may be interposed between the stacked gate electrodes 55. The charge storage layers 53 may be interposed between the diffusion barrier layer 52 and the insulating layers 56. The charge blocking layer 54 may be interposed between the charge storage layers 53 and the stacked gate electrodes 55.

In an example of the structure shown in FIG. 2D, each of the memory cells MC1 and MC2 may include two stacked gate electrodes 55, and the charge storage layer 53 may be interposed between the stacked gate electrodes 55. An upper memory cell MC1 and a lower memory cell MC2 may share the one of the stacked gate electrodes 55.

Figure 3A:
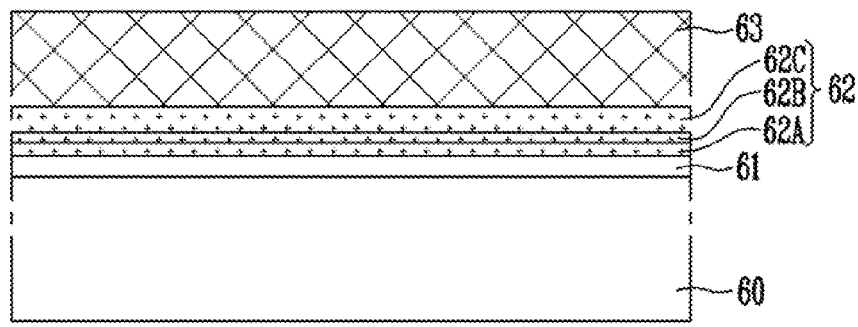
FIGS. 3A to 3C are cross-sectional views illustrating a method of manufacturing a semiconductor device according to an embodiment.
Figure 3B:
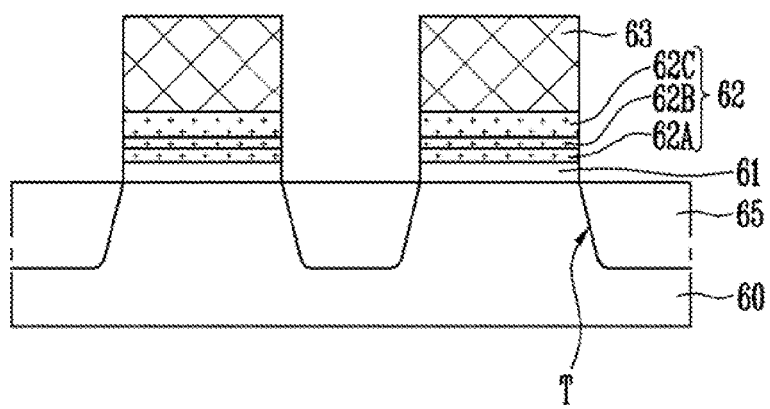
Figure 3C:
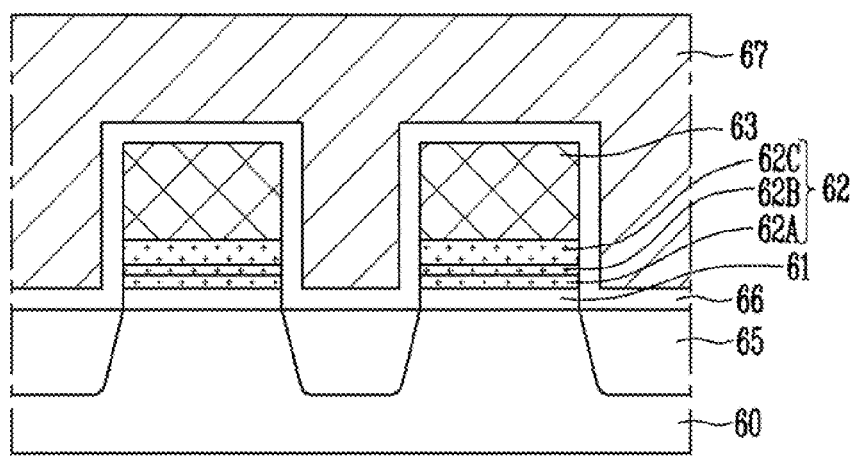

FIGS. 3A to 3C are cross-sectional views illustrating a method of manufacturing a semiconductor device according to an embodiment.

Referring to FIG. 3A, the tunnel insulating layer 61, the diffusion barrier layer 62 and the charge storage layer 63 may be sequentially formed.

As described above, the diffusion barrier layer 62 may include at least one of carbon, nitrogen, or oxygen, and may be formed in a single layer or in a multilayer structure. For example, forming the diffusion barrier layer 62 may include forming an undoped silicon layer 62A using a silicon source gas, and then forming a first doped silicon layer 62B by adding at least one of a carbon source gas, a nitrogen source gas, or an oxygen source gas to the silicon source gas. Subsequently, a second doped silicon layer 62C may be formed by adding at least one of an N-type impurity source gas or a P-type impurity source gas, and at least one of a carbon source gas, a nitrogen source gas, or an oxygen source gas to the silicon source gas. The diffusion barrier layer 62 may be formed through an in-situ process by varying the type of gas added to the silicon source gas.

For example, the silicon source gas may for example, include at least one of silane gas ($SiH_4$) or disilane ($Si_2H_6$), the nitrogen source gas may, for example, include at least one of a $N_2$ gas or a $NH_3$ gas, the carbon source gas may, for example, include a $C_2H_6$ gas, the N-type impurity source gas may, for example, include a phosphorus containing gas such as PH3 gas, and the P-type impurity source gas may, for example, include a boron containing gas such as a BH3 gas or a B2H6 gas.

The diffusion barrier layer 62 may be formed by a deposition method. For example, a low pressure chemical vapor deposition (LP-CVD) method or an atomic layer deposition (ALD) method may be used. The undoped silicon layer 62A may be formed to a thickness of about 10 Å to about 80 Å, the first doped silicon layer 62B may be formed to a thickness of about 5 Å to about 20 Å, and the second doped silicon layer 62C may be formed to a thickness of about 100 Å to about 300 Å.

The charge storage layer 63 may, for example, be a polysilicon layer that is doped with an N-type or a P-type impurity dopant. The diffusion barrier layer 62 and the charge storage layer 63 may be formed by an in-situ process. In this instance, the charge storage layer 63 may be formed by adding a source gas including the N-type or P-type impurity dopant to the silicon source gas.

Referring to FIG. 3B, the charge storage layer 63, diffusion barrier layer 62, and the tunnel insulating layer 61 may be etched by a known process. After etching the charge storage layer 63, the diffusion barrier layer 62 and the tunnel insulating layer 61, an isolation trench T may be formed by etching the substrate 60 to a predetermined depth. Subsequently, an isolation layer 65 may be formed in the isolation trench T. The isolation layer 65 may be formed to completely fill the isolation trench T or partially fill the isolation trench T. For example, an upper surface of the isolation layer 65 may be located lower than the surface of the substrate 60.

Referring to FIG. 3C a charge blocking layer 66 and a conductive layer 67 may be formed over the charge storage layer 63, diffusion barrier layer 62, the tunnel insulating layer 61, and the isolation layer 65. Subsequently, the gate pattern may be formed by etching the conductive layer 67 for the gate electrode, the charge blocking layer 66, the charge storage layer 63, the diffusion barrier layer 62 and the tunnel insulating layers.

Thus, the memory cell includes the diffusion barrier layer 62 interposed between the tunnel insulating layer 61 and the charge storage layer 63.

FIGS. 4A to 4D are cross-sectional views illustrating a method of manufacturing a semiconductor device according to an embodiment.

Figure 4A:
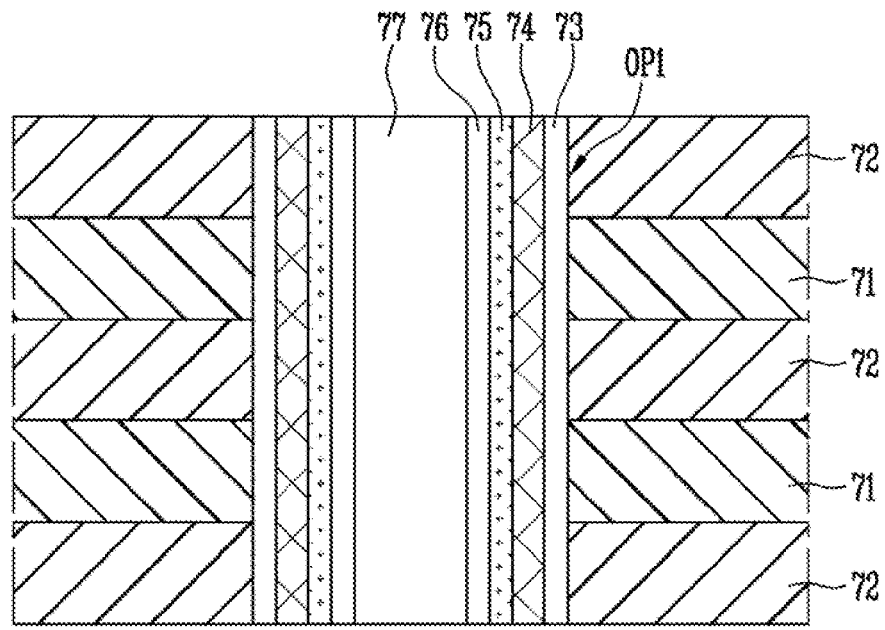
FIGS. 4A to 4D are cross-sectional views illustrating a method of manufacturing a semiconductor device according to an embodiment.

Referring to FIG. 4A, first sacrificial layers 71 and second sacrificial layers 72 may be alternately formed. The first sacrificial layers 71 may form the gate electrodes of the stacked memory cells, and the second sacrificial layers 72 may form the insulating layers that insulate the stacked gate electrodes from each other. The first sacrificial layers 71 may be formed of material having a high etch selectivity with respect to the second sacrificial layers 72. For example, the first sacrificial layers may include a nitride, and the second sacrificial layers 72 may include an oxide.

Subsequently, a first opening OP1 passing through the first sacrificial layers 71 and the second sacrificial layers 72 may be formed. The first opening OP1 may have a circular, an oval, a rectangular, or a polygonal cross-section. Further, a plurality of first openings OP1 may be arranged in a matrix arrangement shape, or in a staggered arrangement.

Subsequently, a first charge blocking layer 73, a charge storage layer 74, a diffusion barrier layer 75, and a tunnel insulating layer 76 may be sequentially formed in the first opening OP1.

Subsequently, a channel layer 77 may be formed on the tunnel insulating layer 76. The channel layer 77 may be formed to have a completely filled central region, or include an open central region. If the channel layer has an open central region, then an insulating layer may be filled in the open central region. Further, although only a part of the channel layer 77 is shown in the figure, the channel layer 77 may have a straight structure extending substantially perpendicular to a surface of the substrate or may have a generally "U"-shaped configuration.

Figure 4B:
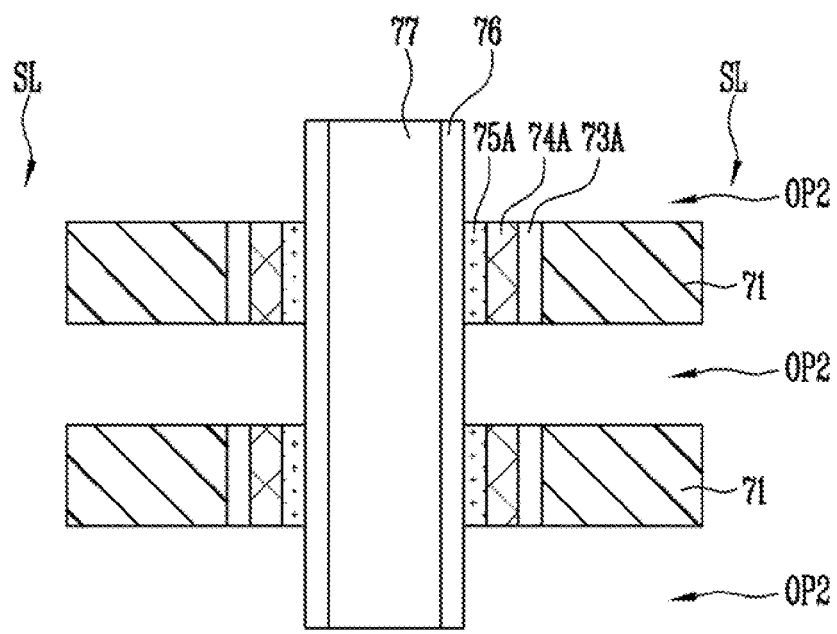

Referring to FIG. 4B, a slit SL may be formed through the first sacrificial layers 71 and the second sacrificial layers 72. Subsequently, second openings OP2 may be formed by removing the second sacrificial layers 72 exposed by the slit SL. Subsequently, portions of the first charge blocking layer 73, the charge storage layer 74, and the diffusion barrier layer 75 exposed by the second openings OP2 may be removed. As a result, first charge barrier patterns 73A, charge storage patterns 74A, and diffusion barrier patterns 75A may be formed in a memory cell region. The charge barrier patterns 73A, the charge storage layer 74, and the diffusion barrier layer 75 are formed in a gap region between the memory cells.

Figure 4C:
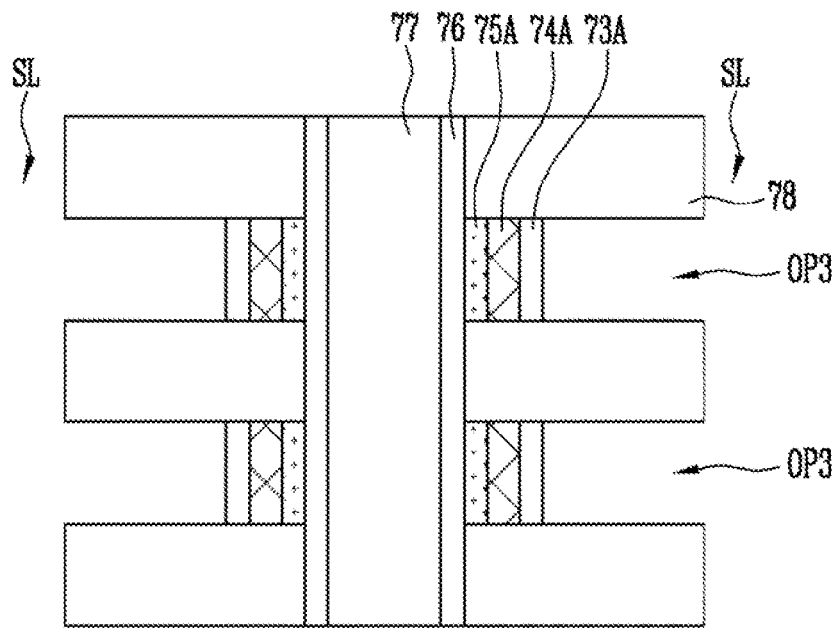

Referring FIG. 4C, insulating layers 78 are formed in the second openings OP2. The first sacrificial layers 71 exposed by the slit SL may then be removed. Third openings OP3 may be formed between the stacked insulating layers 78. Further, the first charge barrier patterns 73A may be exposed through the third openings OP3.

Figure 4D:
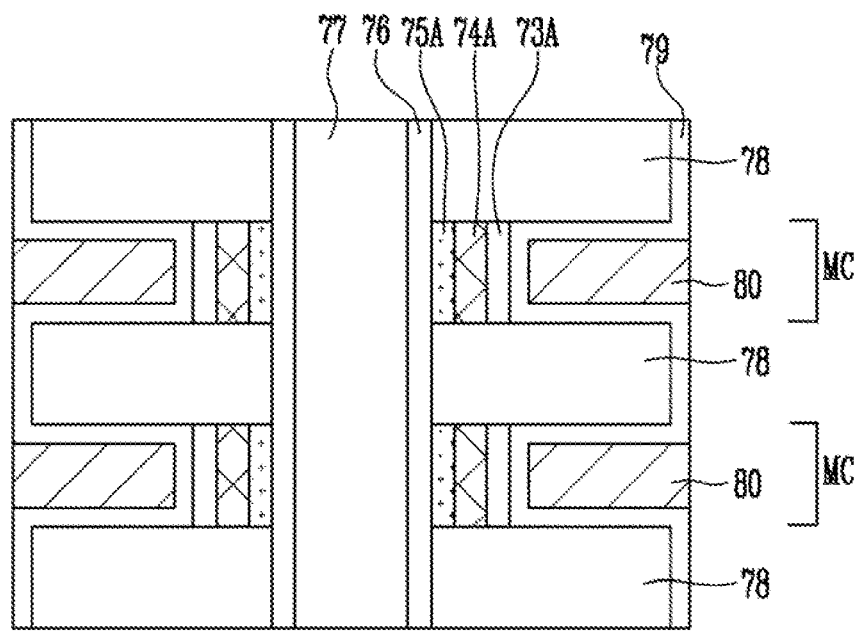

Referring to FIG. 4D, a second charge blocking layer 79 may be formed along surfaces defining the third openings OP3. Conductive layers 80 may then be formed in the third openings. As a result, stacked memory cells MC may be formed, and each of the memory cells MC may include the channel layer 77, the tunnel insulating layer 76, a diffusion barrier pattern 75A, a charge storage pattern 74A, and a first charge barrier pattern 73A, the second charge blocking layer 79, and the conductive layer 80. Further, the diffusion barrier pattern 75A, the charge storage pattern 74A, and the first charge barrier pattern 73A of a stacked memory cell MC may be separated from the diffusion barrier pattern 75A, the charge storage pattern 74A, and the first charge barrier pattern 73A of another stacked memory cell MC by an insulating layer 78.

In an alternative embodiment, conductive layers including the doped polysilicon may be formed instead of the first sacrificial layers 71. In this instance, a process for forming the third openings OP3 may be omitted. Further, a process of siliciding the conductive layers including the doped polysilicon exposed through the slit SL may be additionally performed.

FIGS. 5A to 5D are cross-sectional views illustrating a method of manufacturing a semiconductor device according to an embodiment.

Figure 5A:
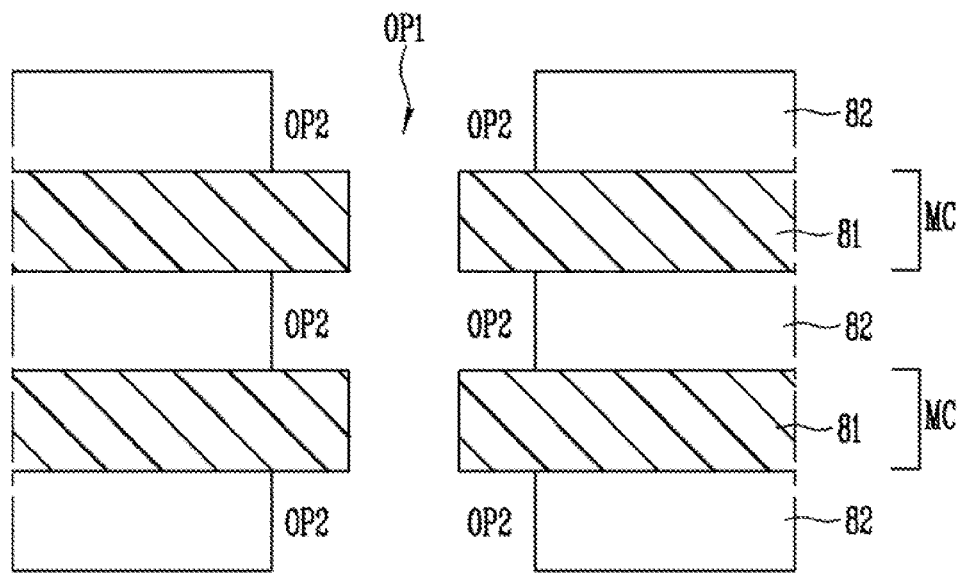
FIGS. 5A to 5F are cross-sectional views illustrating a method of manufacturing a semiconductor device according to an embodiment.

Referring to FIG. 5A, sacrificial layers 81 and insulating layers 82 may be alternately stacked. The sacrificial layers 81 may form the gate electrodes of the stacked memory cells MC, and the insulating layers 82 may be the insulating layers that insulate the stacked gate electrodes from one another. The sacrificial layers 81 may be formed of a material having a high etch selectivity with respect to the insulating layers 82. For example, the sacrificial layers 81 may include a nitride material and the insulating layers 82 may include an oxide material.

A first opening OP1 may be formed through the sacrificial layers 81 and the insulating layer 82. Then, second openings OP2 may be formed by etching portions of the insulating layers 82 exposed through the first opening OP1. As a result, the sacrificial layers 81 may protrude into the first opening OP1.

Figure 5B:
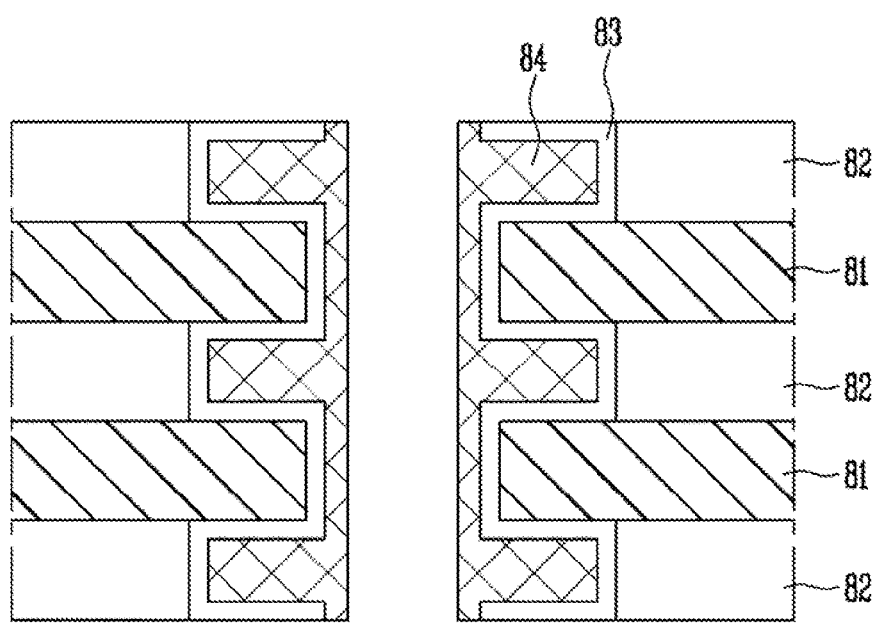

Referring to FIG. 5B, the charge blocking layer 83 may be formed along surfaces defining the first opening OP1 and the second openings OP2. The charge blocking layer 83 may be formed to a thickness that does not completely fill the second openings OP2. Subsequently, a charge storage layer 84 may be formed to fill the second openings OP2. The charge storage layer 84 may be formed in the first opening OP1.

Figure 5C:
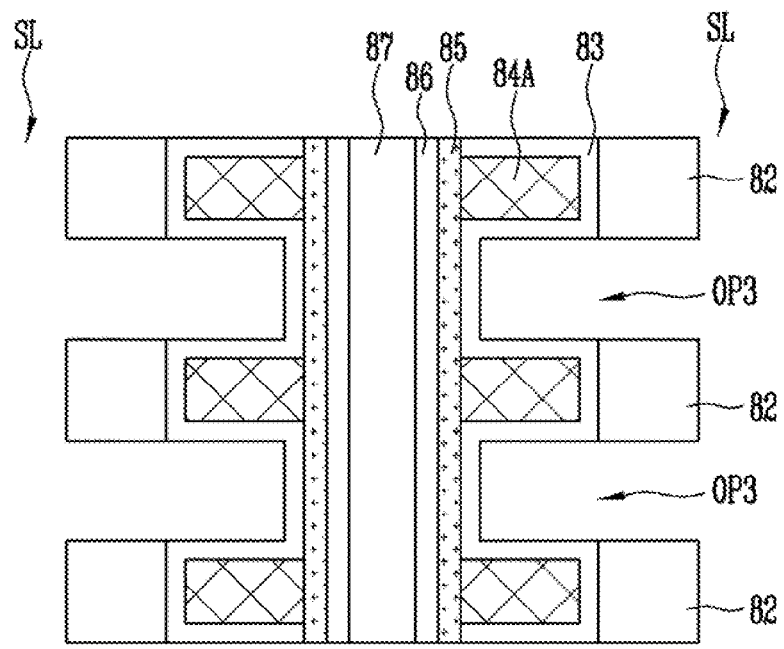

Referring, to FIG. 5C, charge storage patterns 84A may be formed in the second openings OP2 by removing the charge storage layer 84 formed in the first opening OP1. The charge storage patterns 84A may be separated from one another. Subsequently, a diffusion barrier layer 85, a tunnel insulating layer 86, and a channel layer 87 may be sequentially formed in the first opening OP1.

As shown in FIG. 5C, a slit SL may be formed through the sacrificial layers 81 and the insulating layers 82. Third openings OP3 may be formed by removing the sacrificial layers 81 exposed through the slit SL. The charge blocking layer 83 may be exposed through the third openings OP3.

Figure 5D:
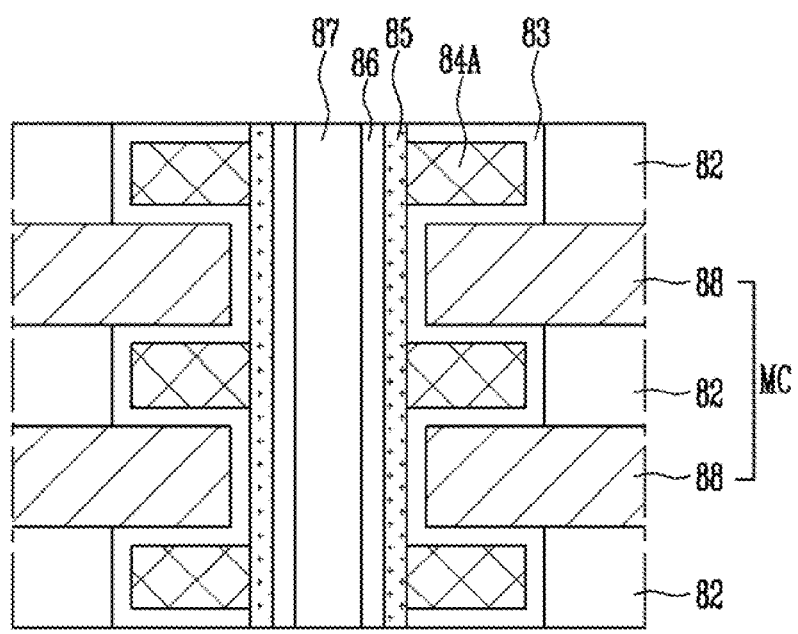

Referring to FIG. 5D, the conductive layers 88 may be formed in the third openings OP3. The conductive layers 88 may form the gate electrode, and may include at least one of tungsten (W), tungsten nitride material ($WN_x$), etc. Thus, a plurality of memory cells MC stacked along the channel layer 87 may be formed. Further, each of the memory cells MC may include the channel layer 87, the tunnel insulating layer 86, the diffusion barrier layer 85, a charge storage pattern 84A, and a conductive layer 88.

Figure 5E:
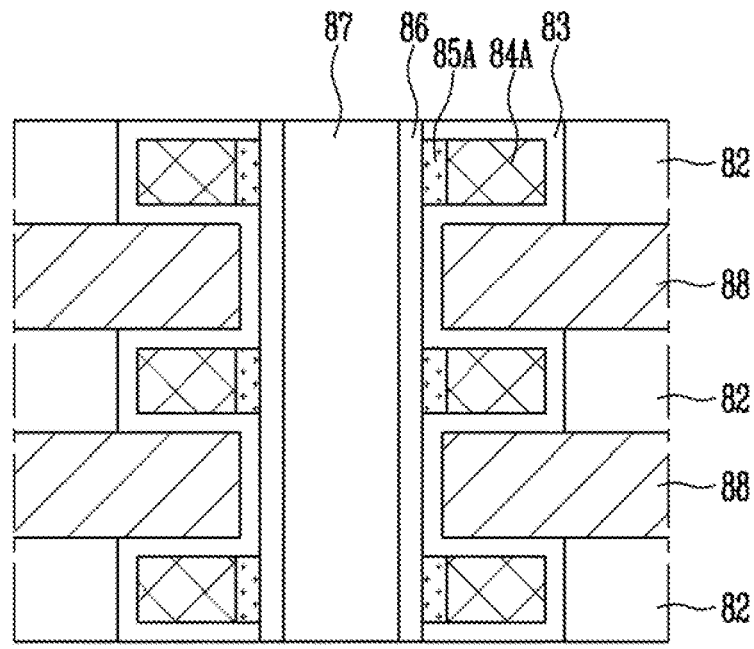
Figure 5F:
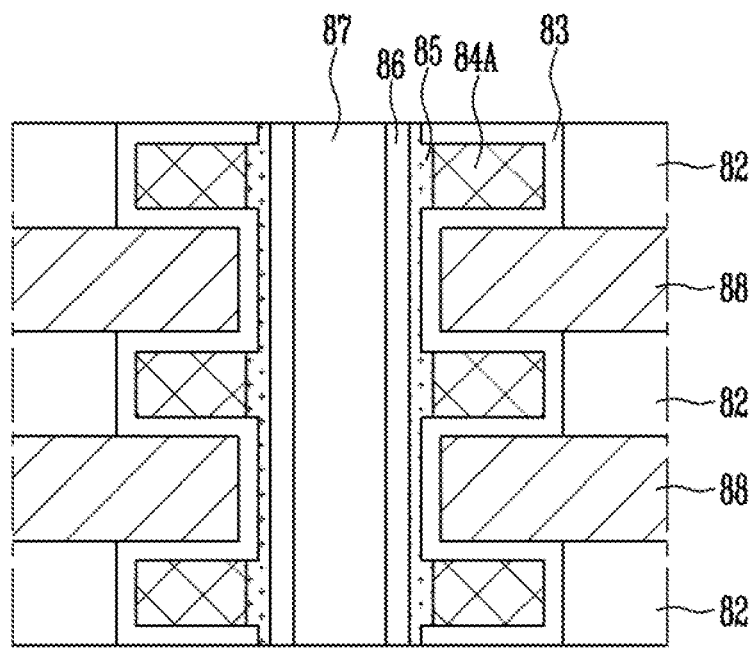

FIGS. 5E and 5F are cross-sectional views illustrating variants of the method described above in which the charge storing layer 84 may not completely fill each of the openings OP2. Referring to FIG. 5E, charge storage patterns 84A and the diffusion barrier layer 85 may be formed in each of the second openings OP2. Referring to FIG. 5F, the diffusion barrier layer 85 may be formed in the first opening OP1 and the second openings OP2. In addition, when the diffusion barrier layer 85 is the multilayer, the part of the multilayer, for example, one of the first doped silicon layer and the second doped silicon layer may be located in the second openings OP2, and the part of the multilayer, for example, the undoped silicon layer may be formed in the first opening OP1.

Figure 6:
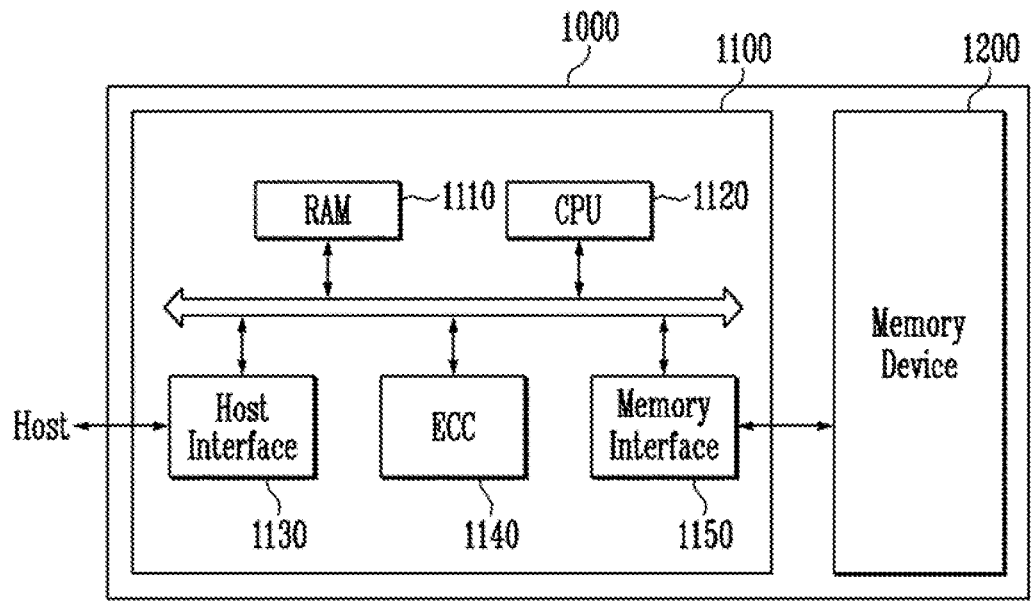
FIGS. 6 and 7 are block views illustrating configuration of a memory system according to an embodiment.

FIG. 6 is a block view illustrating a configuration of a memory system according to an embodiment.

Referring to FIG. 6, a memory system 1000 according to an embodiment may have a memory device 1200 and controller 1100.

The memory device 1200 may be used for storing data information in various data types such as a text, a graphic, and a software code. The memory device 1200 may be a non-volatile memory, and may include the structure described referring to FIGS. 1 to 5D.

The controller 1100 may be coupled to a host and the memory device 1200, and configured to access the memory device 1200 in response to a request from the host. For example, the controller 1100 may be configured to control a read operation, a write operation, an erase operation and a background operation.

The controller 1100 may include, a random access memory (RAM) 1110, a central processing unit (CPU) 1120, a host interface 1130, an error correction code circuit 1140 and a memory interface 1150.

The RAM 1110 may be used as at least one of an operation memory of the CPU 1120, a cache memory between the memory device 120 and the host, or a buffer memory between the memory device 1200 and the host. For the reference, the RAM 1110 may be substituted for a static random access memory (SRAM) or a read only memory (ROM).

The CPU 1120 may be configured to control general operation of the controller 1100. For example, the CPU 1120 may be configured to operate a firmware such as a flash translation layer (FTL) stored in the RAM 1110.

The host interface 1130 may be configured to perform interfacing with the host. For example, the controller 1100 may communicate with the host through at least one of interface protocols—an universal serial bus (USB) protocol, a multimedia card (MMC) protocol, a peripheral component Interconnection (PCI) protocol, a PCI-Express (PCI-Express) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol, or a private protocol, etc.

The ECC circuit 1140 may be configured to detect and correct an error included in data read from the memory device 1200 by using an error correction code ECC.

The memory interface 1150 may be configured to perform interfacing with the memory device 1200. For example, the memory interface 1150 may include a NAND interface and a NOR interface.

The controller 1100 may further include a buffer memory (not illustrated) to temporarily store the data. The buffer memory may be used to temporarily store the data transmitted to the external device through the host interface 1130, or the data transmitted from the memory device 1200 through the memory interface 1150. Further, the controller 1100 may further include a ROM that stores code data to interface with the host.

Figure 7:
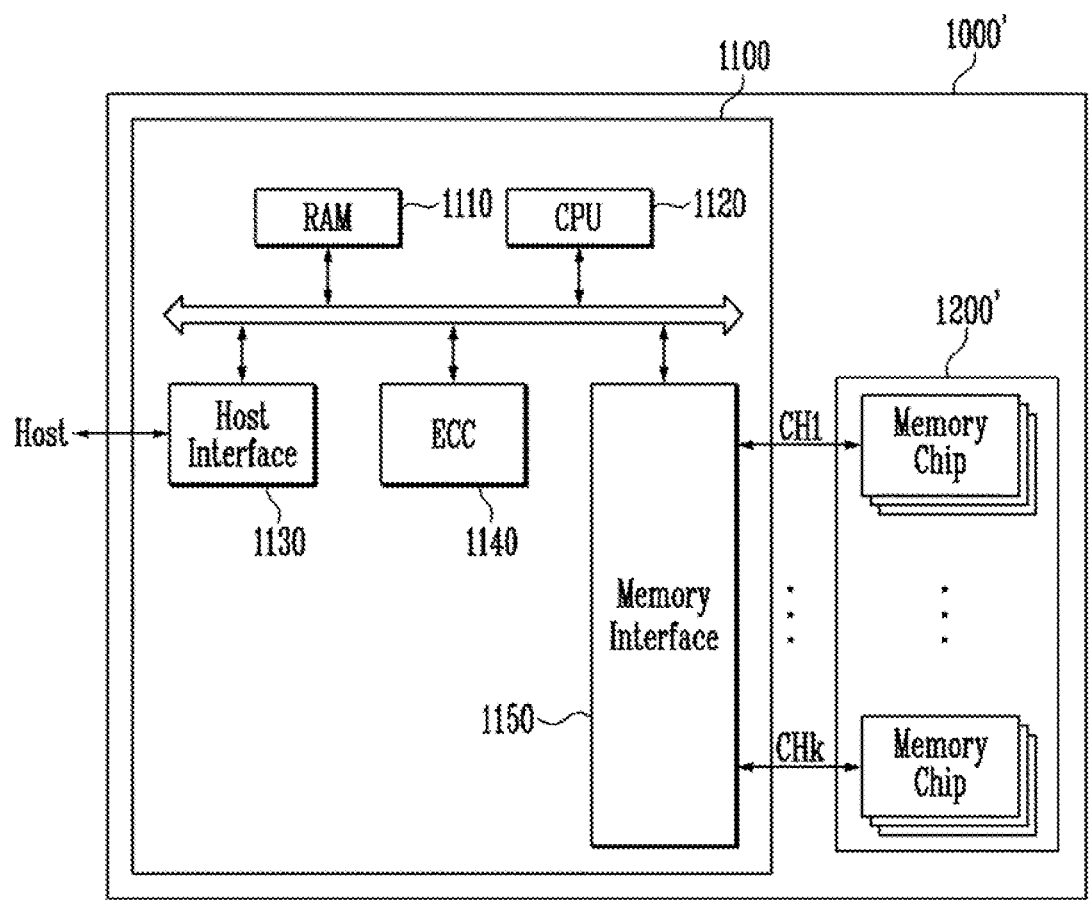

FIG. 7 is a block view illustrating a configuration of a memory system according to an embodiment. Therefore, the detailed description will be omitted.

As shown in FIG. 7, the memory system 1000' according to an embodiment may include a memory device 1200' and the controller 1100. Further, the controller 1100 may include the RAM 1110, the CPU 1120, the host interface 1130, the ECC circuit 1140 and the memory interface 1150.

The memory device 1200' may be a non-volatile memory, and include the memory string described referring to FIGS. 1 to 5D.

In addition, the memory device 1200' may be a multi-chip package including a plurality of memory chips. The plurality of the memory chips can be divided into a plurality of groups, and the plurality of groups may be configured to communicate with the controller 1100 through first to kth channels CH1 to CHk. Further, the memory chips included in a single group may be configured to communicate with the controller 1100 through a common channel. For reference, the memory system 1000 may be modified so that a single memory chip may be coupled to a single channel.

As such, the memory system 1000 may include the memory device 1200 having improved memory characteristics. Specifically, data storage capacity of the memory system 1000 may be increased, and driving speed may be accelerated by configuring the memory device 1200 as the multi-chip package.

Figure 8:
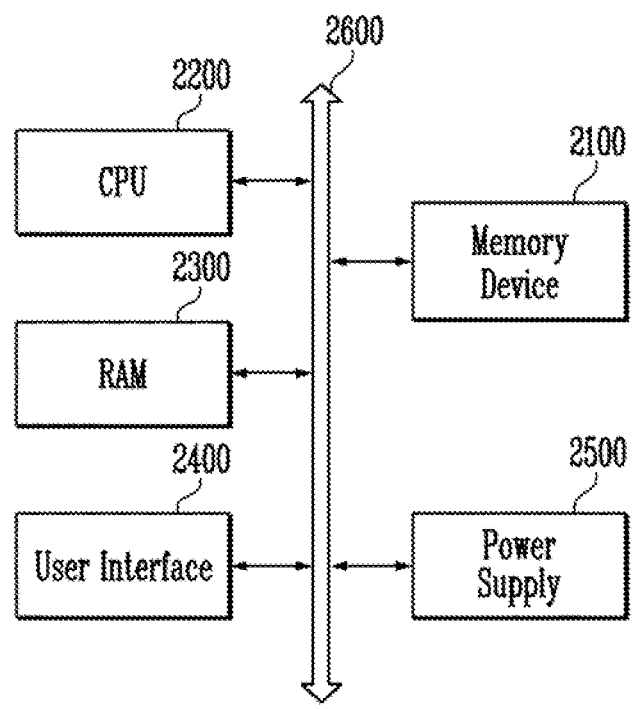
FIGS. 8 and 9 are block views illustrating a configuration of a computing system according to an embodiment.

FIG. 8 is a block view illustrating a configuration of a computing system according to an embodiment. Therefore, the detailed description will be omitted.

As shown in FIG. 8, a computing system 2000 according to an embodiment may include a memory device 2100, a CPU 2200, a RAM 2300, user interface 2400, a power supply 2500, and a system bus 2600.

The memory device 2100 may store the data supplied through the user interface 2400 and the data disposed by the CPU 2200. Further, the memory device 2100 may be coupled to the CPU 2200, the RAM 2300, the user interface 2400 and the power supply 2500 through the system bus 2600. For example, the memory device 2100 may be coupled to the system bus 2600 through a controller (not illustrated) or directly coupled to the system bus 2600. When the memory device 2100 is coupled to the system bus 2600, functions of the controller may be performed by the CPU 2200 and the RAM 2300.

The memory device 2100 may be a non-volatile memory, and include the memory string described above referring to FIG. 1 to FIG. 5D.

Further, the memory device 2100 may be the multi-chip package including the plurality of memory chips described referring to FIG. 7.

The computing system 2000 including the configuration may be at least one of an Ultra Mobile PC (UMPC), a workstation, a net-book, a Personal Digital Assistants (PDA), a portable computer, a web tablet, a wireless phone, a mobile phone, a smart phone, an e-book, a Portable Multimedia Player (PMP), a portable game device, a navigation device, a black box, a digital camera, a three-dimensional television, a digital audio recorder, a digital audio player, a digital picture recorder, a digital picture player, a digital video recorder, a digital video player, a device which enables transmitting/receiving information wireless environment, at least one of various electronic devices configuring a home network, and at least one of various electronic devices configuring a computer network, at least one of various electronic devices configuring a telematics network, or a RFID device.

As such, since the computing system 2000 according to an embodiment includes the memory device 2100 with improved memory characteristics, characteristics and performance of the computing system 2000 may be improved.

Figure 9:
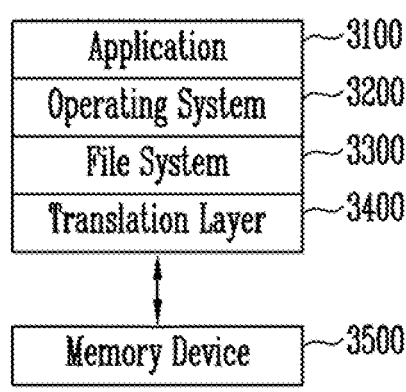

FIG. 9 is a block view illustrating a configuration of a computing system 3000 according to an embodiment.

As shown in FIG. 9, the computing system 3000 according to an embodiment may include a software layer including an operation system 3200, an application 3100, a file system 3300, and a translation layer 3400. Further, the computing system 3000 may include a hardware layer such as the memory device 3500.

The operation system 3200 may manage software source and hardware source of the computing system 3000, and control programming of a central processing unit. The application 3100 may be various application programs performed in the computing system 3000, and a utility performed by the operation system 3200.

The file system 3300 may be a logical structure to manage the data and files, etc. in the computing system 3000, and structuralize the files and data to be stored in the memory device 3500 according to a rule. The file system 3300 may be decided according to the operation system 3200 used in the computing system 3000. For example, when the operation system 3200 belongs to Windows of Microsoft, Inc., the file system 3300 may be a File Allocation Table (FAT) and a NT file system (NTFS). Further, when the operation system 3200 belongs to Unix/Linux, the file system 300 may be an extended file system EXT), a Unix File System (UFS), or journaling file system (JFS).

The operation system 3200, the application 3100 and the file system 3300 may be illustrated in separate blocks in the figure. However, the application 3100 and the file system 3300 may be included in the operation system 3200.

The translation layer 3400 may change an address to a suitable form for the memory device 300 in response to the file system 3300. For example, the translation layer 3400 may change a logic address that the file system formed to a physical address in the memory device 3500. Mapping information between the logic address and the physical address may be stored as an address translation table. For example, the translation layer 3400 may be a Flash Translation Layer (FTL) and a Universal Flash Storage Link Layer (ULL).

The memory device 3500 may be the non-volatile memory, and include the memory string described above referring to FIG. 1 to FIG. 5D.

The computing system 3000 including the configuration may be divided into an operation system layer performed in a high level region, and a controller layer performed in a low level region. The application 3100, the operation system 3200 and the file system 3300 may be included in the operation system layer, driven by an operation memory of the computing system 3000. Further, the translation layer 3400 may be included in the operation system layer or in the controller layer.

As such, the computing system 3000 according to an embodiment may include the memory device 3500 with improved memory characteristics, so that the features and performance of the computing system 3000 may be improved.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the invention as set forth in the following claims.

What is claimed is:

1. A semiconductor device, comprising:
   a tunnel insulating layer;
   a charge storage layer including a dopant; and
   a diffusion barrier layer interposed between the tunnel insulating layer and the charge storage layer to prevent the dopant included in the charge storage layer from being diffused into the tunnel insulating layer, the diffusion barrier layer including at least one of carbon, nitrogen, or oxygen.

2. The semiconductor device of claim 1, wherein the diffusion barrier layer is a silicon layer doped with at least one of carbon, nitrogen, or oxygen.

3. The semiconductor device of claim 2, wherein the at least one of carbon, nitrogen or oxygen is located in at least one of a grain, a grain boundary, or a crystal lattice defect of the doped silicon layer.

4. The semiconductor device of claim 1, wherein the diffusion barrier layer comprises:
   an undoped silicon layer contacting the tunnel insulating layer; and
   a doped silicon layer interposed between the undoped silicon layer and the charge storage layer, the doped silicon layer including at least one of carbon, nitrogen, or oxygen.

5. The semiconductor device of claim 4, wherein the doped silicon layer has a smaller thickness than the undoped silicon layer.

6. The semiconductor device of claim 1, wherein the diffusion barrier layer comprises:
   a first doped silicon layer contacting the tunnel insulating layer, the first doped silicon layer including at least one of carbon, nitrogen, or oxygen; and
   a second doped silicon layer interposed between the first doped silicon layer and the charge storage layer, the second doped silicon layer including at least one of carbon, nitrogen, oxygen, and including boron (B) or phosphorus (P).

7. The semiconductor device of claim 6, wherein the first doped silicon layer has a smaller grain size than the second doped silicon layer.

8. The semiconductor device of claim 6, wherein the first doped silicon layer has a smaller thickness than the second doped silicon layer.

9. The semiconductor device of claim 1, wherein the diffusion barrier layer comprises:
   an undoped silicon layer contacting the tunnel insulating layer;
   a first doped silicon layer contacting the undoped silicon layer, the first doped silicon layer including at least one of carbon, nitrogen or oxygen; and
   a second doped silicon layer interposed between the first doped silicon layer and the charge storage layer, the second doped silicon layer including at least one of carbon, nitrogen, oxygen, and including boron (B) or phosphorus (P).

10. A semiconductor device, comprising:
    alternately stacked conductive layers and insulating layers;
    a channel layer passing through the alternately stacked conductive layers and the insulating layers;
    a tunnel insulating layer surrounding the channel layer;
    charge storage patterns interposed between the tunnel insulating layer and the conductive layers, the charge storage patterns including a dopant; and
    diffusion barrier patterns interposed between the tunnel insulating layer and the charge storage patterns to prevent the dopant included in the charge storage layer from being diffused into the tunnel insulating layer, the diffusion barrier patterns including at least one of nitrogen, carbon or oxygen.

11. The semiconductor device of claim 10, wherein each of the diffusion barrier patterns is silicon layer doped with at least one of nitrogen, carbon, or oxygen.

12. The semiconductor device of claim 11, wherein the at least one of carbon, nitrogen, or oxygen is located in at least one of a grain, a grain boundary, or a crystal lattice defect of the doped silicon layer.

13. The semiconductor device of claim 10, wherein each of the diffusion barrier patterns comprises:
    an undoped silicon layer contacting the tunnel insulating layer; and
    a doped silicon layer interposed between the undoped silicon layer and a corresponding one of the charge storage patterns, the doped silicon layer including at least one of nitrogen, carbon or oxygen.

14. The semiconductor device of claim 10, wherein each of the diffusion barrier patterns comprises:
    a first doped silicon layer contacting the tunnel insulating layer, the first doped silicon layer including at least one of carbon, nitrogen or oxygen; and
    a second doped silicon layer interposed between the first doped silicon layer and a corresponding one of the charge storage patterns, the second doped silicon layer including at least one of carbon, nitrogen, or oxygen, and including boron (B) or phosphorus (P).

15. The semiconductor device of claim 14, wherein the first doped silicon layer has a smaller grain size than the second doped silicon layer.

16. The semiconductor device of claim 10, wherein each of the diffusion barrier patterns comprises:
- an undoped silicon layer contacting the tunnel insulating layer;
- a first doped silicon layer contacting the undoped silicon layer, the first doped silicon layer including at least one of carbon, nitrogen or oxygen; and
- a second doped silicon layer interposed between the first doped silicon layer and a corresponding one of the charge storage patterns, the second doped silicon layer including at least one of carbon, nitrogen, or oxygen, and including boron (B) or phosphorus (P).

17. A semiconductor device, comprising:
- alternately stacked conductive layers and insulating layers;
- a channel layer passing through the alternately stacked conductive layers and the insulating layer;
- a tunnel insulating layer surrounding the channel layer;
- a diffusion barrier layer surrounding the tunnel insulating layer, the diffusion barrier layer including at least one of nitrogen, carbon, or oxygen;
- charge storage patterns interposed between the diffusion barrier layer and the insulating layers, the charge storage patterns including a dopant; and
- a charge blocking layer interposed between the charge storage patterns and the insulating layers, and between the charge storage patterns and the conductive layers,
- wherein the diffusion barrier layer prevents the dopant included in the charge storage layer from being diffused into the tunnel insulating layer.

18. The semiconductor device of claim 17, wherein the diffusion barrier layer comprises:
- an undoped silicon layer surrounding the tunnel insulating layer; and
- a doped silicon layer surrounding the undoped silicon layer, the doped silicon layer doped with at least one of carbon, nitrogen, or oxygen.

19. The semiconductor device of claim 17, wherein the diffusion barrier layer comprises:
- a first doped silicon layer surrounding the tunnel insulating layer, the first doped silicon layer including at least one of carbon, nitrogen, or oxygen; and
- a second doped silicon layer surrounding the first doped silicon layer, the second doped silicon layer including boron (B) or phosphorus (P).

20. The semiconductor device of claim 17, wherein the diffusion barrier layer comprises:
- an undoped silicon layer surrounding the tunnel insulating layer;
- a first doped silicon layer surrounding the undoped silicon layer, the first doped silicon layer including at least one of carbon, nitrogen, or oxygen; and
- a second doped silicon layer surrounding the first doped silicon layer, the second doped silicon layer including at least one of carbon, nitrogen, or oxygen, and including boron (B) or phosphorus (P).

* * * * *